US012690480B1

(12) United States Patent
Paulsen et al.

(10) Patent No.: US 12,690,480 B1
(45) Date of Patent: Jul. 21, 2026

(54) METHOD FOR DEPOSITIVE MODIFICATION OF BALL GRID ARRAY (BGA) COMPONENTS SOLDERED TO CIRCUIT BOARD

(71) Applicant: Rockwell Collins, Inc., Cedar Rapids, IA (US)

(72) Inventors: Jason Paulsen, Robins, IA (US); Nathaniel T. Oster, Marion, IA (US); Nathan Van Schaick, Marion, IA (US); Mary L. Detweiler, Williamsburg, IA (US); Jodee Mae Ross, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 367 days.

(21) Appl. No.: 18/543,479

(22) Filed: Dec. 18, 2023

(51) Int. Cl.
| | |
|---|---|
| *H10W 72/00* | (2026.01) |
| *H10D 1/47* | (2025.01) |
| *H10D 1/68* | (2025.01) |
| *H10W 70/05* | (2026.01) |
| *H10W 70/654* | (2026.01) |
| *H10W 72/29* | (2026.01) |

(52) U.S. Cl.
CPC ............ *H10W 72/019* (2026.01); *H10D 1/47* (2025.01); *H10D 1/68* (2025.01); *H10W 70/05* (2026.01); *H10W 70/654* (2026.01); *H10W 72/29* (2026.01)

(58) Field of Classification Search
CPC . H10W 72/019; H10W 72/29; H10W 70/654; H10W 70/05; H10D 1/47; H10D 1/68

USPC ........................................................ 257/738
See application file for complete search history.

(56) References Cited

U.S. PATENT DOCUMENTS

| | | | |
|---|---|---|---|
| 5,392,980 | A | 2/1995 | Swamy et al. |
| 6,172,879 | B1 | 1/2001 | Cilia et al. |
| 6,220,503 | B1 | 4/2001 | Cox et al. |
| 6,651,322 | B1 | 11/2003 | Currie |
| 6,911,388 | B2 | 6/2005 | Kee et al. |
| 8,250,722 | B2 | 8/2012 | Xia |
| 8,704,377 | B2 | 4/2014 | Rathburn |
| 10,546,828 | B2 | 1/2020 | Kline et al. |

(Continued)

FOREIGN PATENT DOCUMENTS

| | | |
|---|---|---|
| KR | 20090078417 A | 7/2009 |
| KR | 101055507 B1 | 10/2010 |
| KR | 101055527 B1 | 8/2011 |

*Primary Examiner* — Didarul A Mazumder
(74) *Attorney, Agent, or Firm* — Suiter Swantz IP

(57) ABSTRACT
A method for modifying a ball grid array (BGA) component for attachment to a host circuit board includes exposing a set of contact points, and connective paths between the contact points, on the surface of the BGA component. Connections between the contact points are modified (e.g., reworking damaged connections, adding connections overlooked in the design phase or missed in the build phase) by printing or depositing functional materials (e.g., conductive, dielectric, resistive) along paths between the exposed contact points, e.g., via aerosol jetting. If the BGA component is already soldered to a host circuit board, the component is first desoldered and detached prior to modification. After deposition of functional materials, the BGA component is treated to cure the materials and achieve any desired electrical properties associated with the materials and/or modification.

20 Claims, 4 Drawing Sheets

(56) References Cited

U.S. PATENT DOCUMENTS

| | | | |
|---|---|---|---|
| 11,201,066 B2 | 12/2021 | Darveaux et al. | |
| 2009/0001573 A1* | 1/2009 | Jirawongsapiwat .. | H10P 74/207 |
| | | | 228/103 |
| 2014/0295618 A1* | 10/2014 | Kim ..................... | H10W 90/00 |
| | | | 438/108 |
| 2015/0279815 A1* | 10/2015 | Do ....................... | H10W 90/00 |
| | | | 257/737 |
| 2018/0096949 A1* | 4/2018 | Chen ................... | H10W 42/20 |
| 2018/0102470 A1* | 4/2018 | Das ...................... | H10N 60/82 |

\* cited by examiner

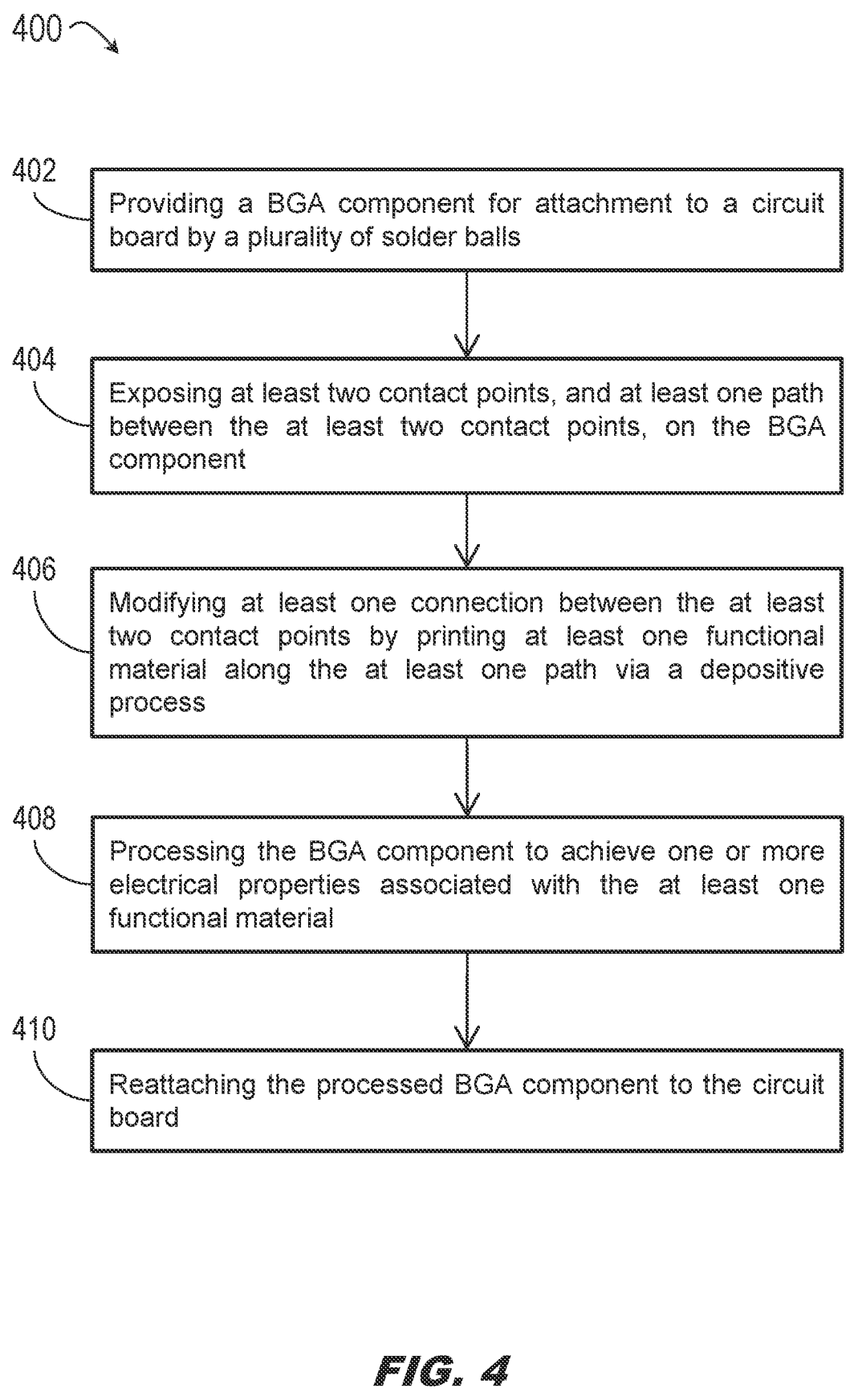

400

402

Providing a BGA component for attachment to a circuit board by a plurality of solder balls

404

Exposing at least two contact points, and at least one path between the at least two contact points, on the BGA component

406

Modifying at least one connection between the at least two contact points by printing at least one functional material along the at least one path via a depositive process

408

Processing the BGA component to achieve one or more electrical properties associated with the at least one functional material

410

Reattaching the processed BGA component to the circuit board

*FIG. 4*

METHOD FOR DEPOSITIVE MODIFICATION OF BALL GRID ARRAY (BGA) COMPONENTS SOLDERED TO CIRCUIT BOARD

BACKGROUND

Contemporary circuit boards (printed circuit boards (PCB)) may include thousands of conductive traces connecting a multitude of components attached to their surface. Lead time and costs for batch production of such circuit boards is a significant component of system design and build processes, and may occupy many months and tens of thousands of dollars all by itself. If, for example, a single conductive trace or conductive pad for a surface-mounted component is missed in the design phase, the omission may not be discovered until much later in testing, at which point the entire board may need to be re-spun at an even greater cost in money and time.

Ball grid array (BGA) components may incorporate an array of solder balls (e.g., attached to the back side of a component chip), the BGA components are soldered down to a circuit board such that connections and traces may be obscured or buried by melted solder or within the layers of the circuit board. If, for example, a connection between contacts on the circuit board is missed until the build stages, the path where the missed connection should be, may not be exposed. Accordingly, the circuit board may not be repairable with "white wires" corresponding to the missed connection and must be re-spun in its entirety.

SUMMARY

In a first aspect, a method for modifying a ball grid array (BGA) component is disclosed. In embodiments, the method includes providing a BGA component to be attached to a host circuit board via solder balls. For example, the BGA component may, or may not, yet be attached to the host circuit board. The method includes exposing two or more contact pads (contact points), and one or more paths between the contact pads, on the surface of the BGA component. The method includes modifying one or more connections between the exposed contact pads (e.g., repairing an existing connection, creating a new connection where none existed) by printing a functional material along the one or more paths according to a depositive process. The method includes post-printing processing of the BGA component to achieve desired electrical properties associated with the functional material.

In some embodiments, the method includes printing the functional material via aerosol jetting process.

In some embodiments, the method includes creating an electrical connection between the contact points by printing a conductive material.

In some embodiments, the method includes establishing a pull-up or pull-down resistor by printing a resistive material.

In some embodiments, the method includes establishing a multi-layer connection between the contact pads by printing a first layer of functional material and at least one second layer of functional material (which may be a different functional material than the first layer) at least partially overlapping the first layer.

In some embodiments, the method includes establishing a capacitive structure by printing a layer of dielectric material at least partially between two layers of conductive material.

In some embodiments, the method includes printing a first path between two or more contact points, printing an insulating material over a portion of the first path, and printing a second path between the two or more contact points (e.g., which may be different contact points than the first path) crossing over the first path where the insulating material is printed.

In some embodiments, the method includes printing functional material along an indirect path between two or more contact points, e.g., where other contact points or solder balls impede a straight-line path or the contact points are not directly adjacent.

In some embodiments, the method includes printing an indirect path between two contact points that does not correspond to the shortest possible path between the two contact points.

In embodiments, the method includes, e.g., where the BGA component is attached to a host circuit board via solder balls, removing one or more solder balls to expose two or more contact points and detaching the BGA component from the host circuit board.

In some embodiments, the method further comprises re-attaching the printed and post-processed BGA component to the host circuit board.

In some embodiments, the method includes thermally treating the BGA component (including the printed functional material) to achieve the desired electrical properties.

In some embodiments, the method includes exposing the BGA component (including the printed functional material) to electromagnetic radiation (e.g., laser energy) or to a chemical environment to achieve the desired electrical properties.

In a further aspect, a modified ball grid array (BGA) component is also disclosed. In embodiments, the BGA includes a set of contact pads (contact points) which may be coupled to a host circuit board, e.g., via solder balls. For example, the BGA component includes at least one modified connection between two or more contact pads on the surface of the BGA component, where each modified connection is fashioned by: exposing two or more contact pads and at least one path between the contact pads; printing one or more functional materials along the at least one path (via at least one depositive process) to create the modified connection, and processing the BGA component and printed functional materials to achieve desired electrical properties associated with the functional materials.

In some embodiments, the functional materials are printed via aerosol jetting process.

In some embodiments, the modified connections include multi-layer connections wherein a first layer of functional material is printed along the path, and at least one second layer (e.g., of a different functional material) is printed at least partially overlapping the most recently printed layer.

In some embodiments, the at least one second layer includes an insulating material printed over a first layer of functional material along a first path, and a second layer of functional material along a second path crossing over the first layer where the insulating material is printed, the insulating material mutually insulating the first and second paths.

In some embodiments, the BGA component is initially coupled to a host circuit board via a set of solder balls, and exposing the two or more contact points includes detaching the BGA component from the host circuit board and removing any solder balls obscuring the desired contact points.

In some embodiments, the modified connections include an indirect path between two contact points not directly adjacent to each other (e.g., where a direct path may be obstructed by other solder balls or contact pads) or where the indirect path does not correspond to the shortest path between the two contact pads.

In some embodiments, post-printing processing of the BGA component (and the printed functional materials) to achieve the desired electrical properties includes thermal treatment, exposure to a chemical environment, and/or exposure to electromagnetic radiation (e.g., laser energy).

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

and FIG. 4 is a flow diagram illustrating a method for modifying a BGA component and circuit board assembly according to example embodiments of this disclosure.

DETAILED DESCRIPTION

Figure 1:
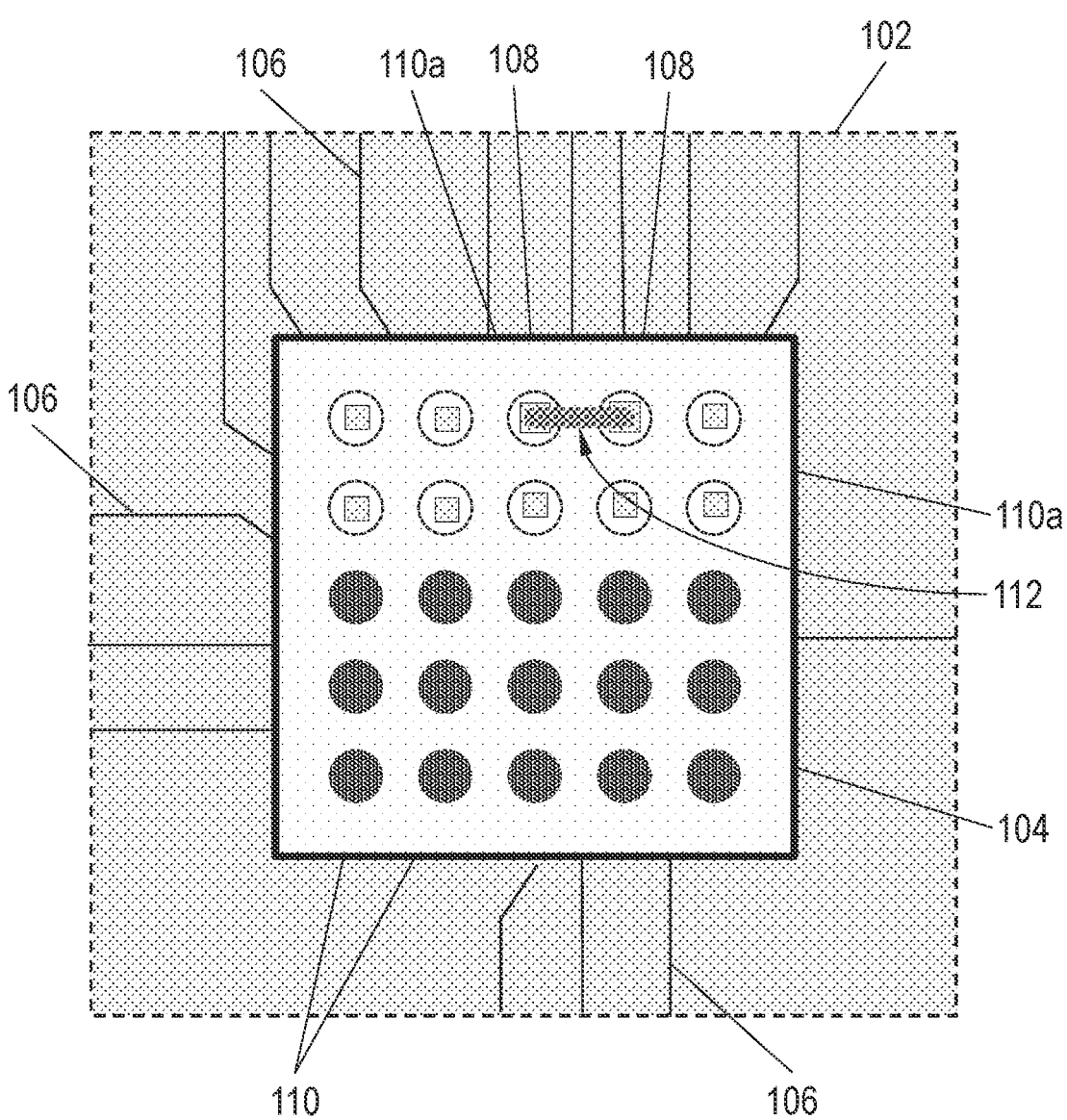
FIG. 1 is an overhead view of a ball grid array (BGA) component and circuit board assembly modified according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to methods and system for reworking and/or modification of missed connections or contacts on a BGA component. For example, if a missed connection or other error is detected before the BGA component is soldered to a circuit board, modification of connections via addition of functional material as described below may be made directly to the BGA component. Otherwise, if the BGA component has already been soldered to the circuit board, the BGA component should then be desoldered from the circuit board and any solder balls covering a crucial contact point (e.g., any contact pad serving as an endpoint of a missed connection), trace, or other path to be modified between contact points, should be removed. Once modifications have been made between the crucial contact points and/or along paths between, the BGA component may be resoldered to the circuit board. When the crucial contact points and/or paths therebetween have been exposed, functional material is printed on the BGA component or PCB to resolve missed connections or add functionality. Post-processing of the BGA component assembly may be employed to achieve the desired electrical properties associated with the modifications. In this way, missed or erroneous contacts or connections may be precisely repaired or modified, in that the selection and amount of material deposited may be tailored to specific needs or conditions of the rework or modification. Further, re-design and or re-spinning of the BGA component assembly may be avoided, and the BGA component modified without disturbing other traces, contacts, or components within the component assembly.

Figure 2:
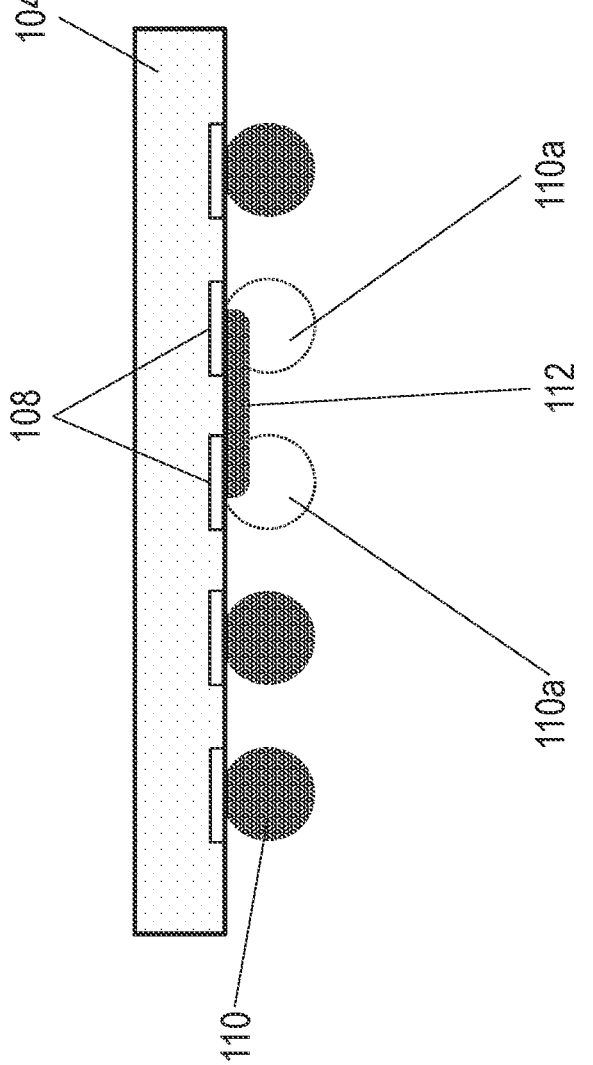
FIG. 2 is a profile view of the BGA component and circuit board assembly of FIG. 1, modified according to example embodiments of this disclosure.
Figure 2:

Referring now to FIGS. 1 and 2, the BGA component assembly 100 is shown respectively in overhead (FIG. 1) and profile (FIG. 2) views, and may include a circuit board 102 (e.g., printed circuit board (PCB)), component chip 104, conductive connection traces 106, conductive contact pads 108, and solder balls 110.

In embodiments, the component chip 104 may be attached to the host circuit board 102 via a two-dimensional (2D) array (e.g., M columns×M rows or M columns×N rows, where M, N are integers and M #N) of solder balls 110. However, neither the arrangement of solder balls 110 nor the underlying arrangement of contact pads 108 need be a uniform 2D array of rows and columns. For example, each solder ball 110 may obscure a contact pad 108 (e.g., contact points) and/or a connection point for a trace 106 on the PCB 102 (e.g., the connection traces connecting contact pads 108 of the component chip 104 through a solder ball 110 to one or more connections on the PCB 102, extending outward from the component chip to points or contacts elsewhere on the host circuit board). Further, these obscured connection traces 106 or contact pads 108 may include missed connections or contacts, or other design or build errors within the BGA component assembly 100. For example, a connection between two contact pads 108 on the component chip 104 may have been overlooked in the design phase of the PCB 102 or missed in the build phase of the BGA component assembly 100. Further still, the design of the BGA component assembly 100 may explicitly provide that a functional connection between two or more contact pads 108 be made directly on the BGA component chip 104 (rather than through the PCB 102) for reasons including, but not limited to: tuning the circuitry, simplifying the overall assembly design, footprint reduction, or trace routing on the PCB 102.

In embodiments, modifying a connection may include adding a connection where one did not previously exist. For example, modification may include adding one or more of an electrical connection, a resistor (e.g., pull-up or pull-down), or a capacitor (or other passive electronic component) along a path between two contact pads 108, along multiple paths between two or more contact pads. Alternatively, modification may include connecting one or more contact pads 108 to a ground contact (e.g., another contact pad already connected to ground). In some embodiments, a connection trace 106 may exist between two or more contact pads 108 but may require modification, e.g., in order to achieve desired electrical properties not satisfied by the current connection trace.

In embodiments, the BGA component assembly 100 may be modified by exposing any contact pads 108 defining the connection trace to be modified or created (e.g., an electrical connection or electronic component between the contact pads). For example, if the BGA component chip 104 is currently soldered to a PCB 102, the component chip may be desoldered and detached from the PCB. Similarly, any solder balls 110 covering any relevant contact pads 108 or paths therebetween may be removed. In embodiments, exposing the relevant contact pads 108 (and/or a connective paths therebetween) may allow one or more connection traces to be modified or created without otherwise disturbing the subsequent attachment or re-attachment of the component chip 104 to the host circuit board 102, and without otherwise disturbing components of the BGA component assembly 100.

In embodiments, when the relevant contact pads 108 have been exposed, modification or creation of connection traces on the component chip 104 may be achieved via aerosol jetting (e.g., or via other appropriate depositive/additive manufacturing processes) of functional material 112 along one or more exposed connective paths between the contact pads 108. For example, the selection and amount of functional material 112 to be deposited may be tailored to specific repair objectives or desired electrical properties. In some embodiments, the functional material 112 may include silver nanoparticle ink or an appropriate like conductive material, e.g., to establish an electrical connection or circuit between the contact pads 108. In some embodiments, the functional material 112 may include carbon ink or an appropriate like electrically resistive material, e.g., to establish a pull-up or pull-down resistor between the contact pads 108. For example, and as noted in greater detail below, the amount of carbon ink used may be tailored to a target resistance, e.g., by shortening or lengthening the resistive connective path between the contact pads 108.

In embodiments, the use of aerosol jetting (e.g., the Aerosol Jet process developed by Optomec, Inc.) or like additive manufacturing processes may provide for sufficiently narrow features (e.g., lines of deposited functional material 112 may be drawn as narrow as 20 μm) to allow for deposition of individual discrete lines between adjacent contact pads 108 or solder balls 110. Further, aerosol jetting may provide for significant standoff distance (e.g., ~5 mm) of the print head from the surface of the component chip 104 to allow narrow features to be printed on surfaces with significant topography (e.g., typically 2-5 μm in thickness, but as thick as 2 mm if required), without disturbing adjacent solder balls 110 (where, for example, ink jetting, screen printing, pad printing, and other additive manufacturing or contact processes may require a much closer standoff distance, and where the presence of large solder balls would interfere with the deposition process).

In embodiments, modification of the component chip 104 and/or BGA component assembly 100 may include post-deposition processing of the deposited functional material, the component chip, and/or the BGA component assembly as a whole to achieve any desired electrical properties associated with the functional material 112 deposited to the component chip 104. For example, some functional material 112 (e.g., silver nanoparticle ink) may be subjected to thermal treatment or curing. In other embodiments, corrective material 112 (e.g., dielectric material) may be exposed to ultraviolet light, laser energy, or other specific wavelengths of electromagnetic (EM) radiation, to cure the corrective material. Further, the functional material 112 may be exposed to specific chemical environments, e.g., according to post-processing guidelines corresponding to a specific functional material.

Figure 3:
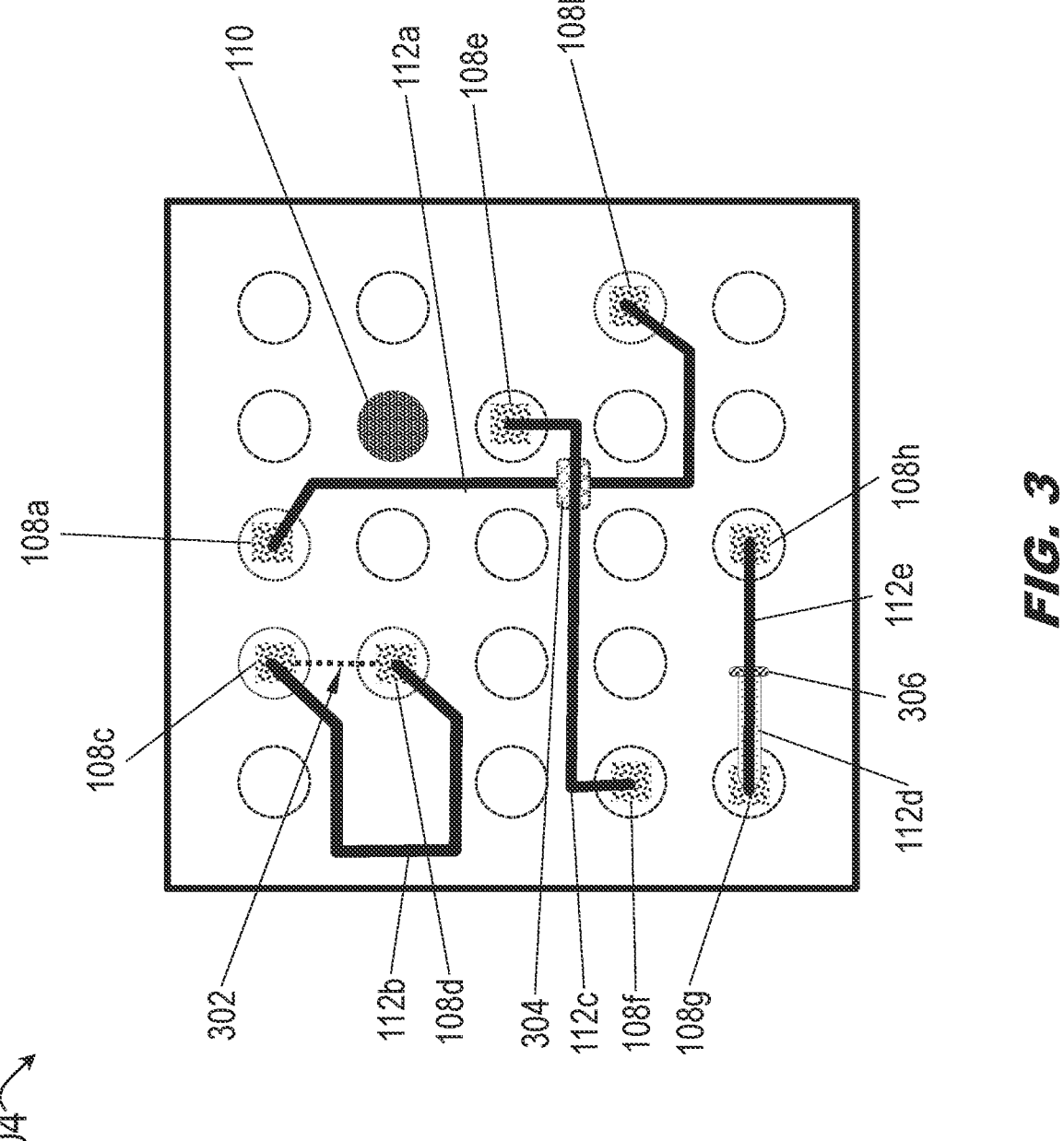
FIG. 3 is an overhead view of the BGA component and circuit board assembly of FIG. 1, modified according to example embodiments of this disclosure.

Referring now to FIG. 3, the BGA component chip 104 is shown in overhead view.

In embodiments, and as noted above, the precision achievable via aerosol jetting or like depositive processes may allow printing of functional material 112a along a toolpath, connective trace, or other path connecting non-adjacent contact pads 108a, 108b. For example, non-adjacent contact pads 108a, 108b may be defined as contact pads not directly adjacent to each other, or where at least one contact pad (108, FIG. 1) or solder ball 110 therebetween may otherwise impede a straight-line shortest path between the two contact pads 108a, 108b. Similarly, it may be observed that the modified connection formed between the contact pads 108a, 108b by the deposited functional material 112a may not correspond to a shortest path.

In embodiments, modification of the BGA component assembly 100 may likewise include printing of functional material 112b along a toolpath or connective trace expressly chosen not to correspond to a shortest or most direct path between two contact pads 108c, 108d (e.g., whether or not the said contact pads are adjacent to each other, and whether or not the shortest or most direct path exists). For example, the corrective material 112b may include carbon ink or like resistive material, but the desired electrical properties may include more resistance between the adjacent contact pads 108c, 108d than a direct shortest path 302 between the contact pads would provide. Accordingly, the functional material 112b may be printed in an indirect path between the contact pads 108c, 108d in a raster pattern of sufficient length to provide the desired resistance, even if the shorter direct path 302 is unimpeded.

In some embodiments, modification of the BGA component assembly 100 may include multi-layer printing or deposition of functional material to create a multi-layer feature along one or more toolpaths or connection traces between two or more contact pads. For example, the component chip 104 may be modified to create a connection by depositing functional material 112c between the contact pads 108e, 108f in such a way that the paths of the functional materials 112a, 112b may intersect at a crossover point. In embodiments, the functional material 112a may first be printed or deposited between the contact pads 108a, 108b. A dielectric material 304 (e.g., or other like insulating material) may be deposited over the functional material 112a at the crossover point, e.g., to isolate the functional material 112a. Further, the functional material 112c may be printed between the contact pads 108e, 108f, crossing over the dielectric material 304 at the crossover point such that the two layers 112a, 112c of functional material are mutually insulated from each other.

In some embodiments, multi-layer deposition of functional material 112 may be employed to create a capacitive structure between contact pads 108g, 108h. For example, a conductive material 112d may first be printed in a path extending from the contact pad 108g partially toward the contact pad 108h, e.g., just over half the distance between the two contact pads. Further, a dielectric material 306 may be printed over a small portion of the conductive material 112d (e.g., where the distance between the two contact pads 108g, 108h is M millimeters, and the length of the conductive material 112d is (M/2)+N millimeters, the dielectric material 306 may extend from (M/2) to (M/2)+N millimeters). Finally, another layer of conductive material 112e may be printed along the full path between the contact pads 108g, 108h, overlapping the first layer of conductive material 112d and the dielectric material 306 and completing the capacitive structure.

Referring now to FIG. 4, the method 400 may be implemented to modify the BGA component assembly 100 and may include the following steps.

At a step 402, a BGA component assembly is provided wherein a component chip is to be attached to a host circuit board by an array of solder. For example, the modification may be made prior to initial attachment of the component chip to the host circuit board. Alternatively, if it is known a modification will be needed subsequent to the initial attachment of the BGA component, the BGA component may be desoldered and detached from the host circuit board.

At a step 404, two or more contact points (e.g., contact pads) on the surface of the component chip, and at least one path between the two or more contact points, are exposed. For example, if the BGA component has been detached from a host circuit board and solder balls are obscuring one or more of the contact points and/or paths to be modified, said solder balls are removed. In some embodiments, the contact points are non-adjacent; for example, other solder balls or contact points may impede a direct path between the two contact points. In some embodiments, the trace paths for a modified or created connection may expressly not correspond to the shortest paths between contact points.

At a step 406, one or more connection traces are modified or created by the printing or deposition of functional materials along path(s) between contact points. In some embodiments, functional materials are printed or deposited via aerosol jetting. In some embodiments, functional materials include conductive materials. In some embodiments, functional materials include resistive materials. In some embodiments, functional materials are printed in one or more layers (which may incorporate combinations different functional materials) to create multi-layer connective traces. For example, dielectric materials may be printed over a connective trace to allow another connective trace to cross over the first trace while both traces are insulated from each other. Similarly, conductive and dielectric materials may be printed in layers to create a capacitive structure between contact points.

At a step 508, the BGA component chip is treated or processed post-deposition to achieve the desired electrical properties associated with and/or cure the applied functional materials. Alternatively, the BGA component assembly can be treated or processed as an entire assembly post-deposition to achieve the desired electrical properties associated with and/or cure the applied functional materials. In some embodiments, the BGA chip or the BGA component assembly is thermally treated. In some embodiments, the BGA chip or the BGA component assembly is exposed to ultraviolet light, laser energy, or other specific wavelengths or spectra of electromagnetic radiation. In other embodiments, the BGA chip or BGA component assembly is exposed to a chemical environment to treat or cure the deposited functional material.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:

1. A method for modifying a ball grid array (BGA) component, the method comprising:
   providing the BGA component for attachment to a circuit board by a plurality of solder balls;
   exposing at least two contact points, and at least one path between the at least two contact points, on the BGA component;
   modifying at least one connection between the at least two contact points by printing at least one functional material along the at least one path via a depositive process; and
   processing the BGA component to achieve one or more electrical properties associated with the at least one functional material.

2. The method of claim 1, wherein modifying the at least one connection between the at least two contact points by printing the at least one functional material along the at least one path via the depositive process includes:

printing the at least one functional material along the at least one path via an aerosol jetting process.

3. The method of claim 1, wherein modifying the at least one connection between the at least two contact points by printing the at least one functional material along the at least one path via the depositive process includes:

creating an electrical connection between the at least two contact points by printing at least one conductive material along the at least one path.

4. The method of claim 1, wherein modifying the at least one connection between the at least two contact points by printing the at least one functional material along the at least one path via the depositive process includes:

establishing at least one of a pull-up resistor or a pull-down resistor between the at least two contact points by printing at least one resistive material along the at least one path.

5. The method of claim 1, wherein modifying the at least one connection between the at least two contact points by printing the at least one functional material along the at least one path via the depositive process includes:

establishing a multi-layer connection between the at least two contact points by:

printing a first layer of the at least one functional material along the at least one path;

and printing at least one second layer of the at least one functional material at least partially over the first layer.

6. The method of claim 5, wherein establishing the multi-layer connection between the at least two contact points includes:

establishing at least one capacitor along a path between the at least two contact points by:

printing at least one conductive material along a first portion of the path;

printing at least one dielectric material over a second portion of the conductive material;

and printing the at least one conductive material along the path and over the first and second portions.

7. The method of claim 5, wherein establishing a multi-layer trace between the at least two contact points includes:

modifying a first path between the at least two contact points;

and modifying a second path between the at least two contact points, the second path crossing the first path at a crossing point, by:

printing a first layer of the at least one functional material along the first path;

printing at least one insulating material over the first layer at the crossing point;

and printing a second layer of the at least one functional material along the second path and over the at least one insulating material at the crossing point.

8. The method of claim 1, wherein:

exposing the at least two contact points, and the at least one path between the at least two contact points, on the BGA component includes:

exposing at least one indirect path connecting the at least two first contact points, wherein the at least two first contact points are not directly adjacent to each other and wherein one or more second contact points impede a straight-line path between the at least two first contact points;

and wherein modifying the at least one connection between the at least two contact points by printing the at least one functional material along the at least one path via the depositive process includes:

printing the at least one functional material along the at least one indirect path.

9. The method of claim 1, wherein modifying the at least one connection between the at least two contact points by printing the at least one functional material along the at least one path via the depositive process includes:

printing the at least one functional material along at least one path between a first contact point and a second contact point not corresponding to a shortest path between the first and second contact points.

10. The method of claim 1, wherein exposing the at least two contact points, and the at least one path between the at least two contact points, on the BGA component includes at least one of:

removing at least one solder ball covering the at least two contact points;

or detaching the BGA component from the circuit board.

11. The method of claim 10, further comprising:

re-attaching the processed BGA component to the circuit board.

12. The method of claim 1, wherein processing the BGA component to achieve the one or more electrical properties associated with the at least one functional material includes:

thermally treating the at least one functional material to achieve the one or more electrical properties.

13. The method of claim 1, wherein processing the BGA component to achieve the one or more electrical properties associated with the at least one functional material includes:

exposing the at least one functional material to at least one of electromagnetic (EM) radiation or a chemical environment to achieve the one or more electrical properties.

14. A modified ball grid array (BGA) system, the modified BGA system comprising:

a ball grid array (BGA) component including a plurality of contact points;

wherein the BGA component includes at least one modified connection between two or more first contact points of the plurality of contact points, the at least one modified connection fashioned by:

exposing the two or more first contact points and at least one path between the two or more first contact points;

creating the at least one modified connection by printing, via at least one depositive process, at least one functional material along the at least one path;

and processing the BGA component to achieve at least one electrical property associated with the at least one functional material.

15. The modified BGA system of claim 14, wherein the at least one depositive process includes an aerosol jetting process.

16. The modified BGA system of claim 14, wherein the at least one modified connection includes a multi-layer connection comprising:

at least one first layer of the at least one functional material printed along the at least one path;

and
at least one second layer of the at least one functional material printed at least partially over the at least one first layer, each second layer associated with at least one second corrective material.

17. The modified BGA system of claim 16, wherein:
the at least one first layer is printed along a first path;
wherein the at least one second layer is printed along a second path, the first path and the second path crossing at one or more crossover points;
and
wherein at least one insulating material is printed over the at least one first layer at the one or more crossover points, the at least one second layer printed over the at least one insulating material.

18. The modified BGA system of claim 14, wherein exposing the two or more first contact points and at least one path between the two or more first contact points includes at least one of:
removing at least one solder ball covering the at least two first contact points;

or
detaching the BGA component from a circuit board.

19. The modified BGA system of claim 14, wherein the at least one path includes one or more of:
a path between at least two first contact points not directly adjacent to each other;
or
a path between two contact points that does not correspond to the shortest path between the two contact points.

20. The modified BGA system of claim 14, wherein processing the at least one BGA component includes at least one of:
thermally treating the at least one functional material;
exposing the at least one functional material to a chemical environment;
or exposing the at least one functional material to electromagnetic (EM) radiation.

\* \* \* \* \*